United States Patent [19]
Bishop et al.

[11] Patent Number: 5,674,652
[45] Date of Patent: Oct. 7, 1997

[54] DIFFRACTED LIGHT FROM LATENT IMAGES IN PHOTORESIST FOR EXPOSURE CONTROL

[75] Inventors: Kenneth P. Bishop, Rio Rancho; Steven R. J. Brueck, Albuquerque; Susan M. Gaspar, Albuquerque; Kirt C. Hickman, Albuquerque; John R. McNeil, Albuquerque; S. Sohail H. Naqvi, Albuquerque; Brian R. Stallard, Albuquerque; Gary D. Tipton, Albuquerque, all of N. Mex.

[73] Assignee: University of New Mexico, Albuquerque, N. Mex.

[21] Appl. No.: 662,676

[22] Filed: Feb. 28, 1991

[51] Int. Cl.[6] ............................................. G03F 7/20
[52] U.S. Cl. ..................................... 430/30; 430/311
[58] Field of Search ............................ 430/30, 311, 394, 430/395

[56] References Cited

U.S. PATENT DOCUMENTS

| | | | |
|---|---|---|---|
| 4,462,688 | 7/1984 | Gold | 356/328 |
| 4,701,606 | 10/1987 | Tanimoto et al. | 250/201 |
| 4,769,551 | 9/1988 | Hamashima et al. | 250/548 |
| 5,048,967 | 9/1991 | Suzuki et al. | 356/401 |
| 5,124,216 | 6/1992 | Giapis | 430/30 |

FOREIGN PATENT DOCUMENTS

| | | | |
|---|---|---|---|
| 1165116 | 6/1989 | Japan | 430/30 |
| 1228130 | 9/1989 | Japan | 430/30 |
| 225852 | 1/1990 | Japan | 430/30 |

OTHER PUBLICATIONS

M. G. Moharram and T. K. Gaylord, "Diffraction analysis of dielectric surface–relief gratings," J. Opt. Soc. Am. 72, 1385–1892, 1982.

*Primary Examiner*—Kathleen Duda
*Attorney, Agent, or Firm*—Snell & Wilmer L.L.P.

[57] ABSTRACT

In microelectronics manufacturing, an arrangement for monitoring and control of exposure of an undeveloped photosensitive layer on a structure susceptible to variations in optical properties in order to attain the desired critical dimension for the pattern to be developed in the photosensitive layer. This is done by ascertaining the intensities for one or more respective orders of diffracted power for an incident beam of radiation corresponding to the desired critical dimension for the photosensitive layer as a function of exposure time and optical properties of the structure, illuminating the photosensitive layer with a beam of radiation of one or more frequencies to which the photosensitive layer is not exposure-sensitive, and monitoring the intensities of the orders of diffracted radiation due to said illumination including at least the first order of diffracted radiation thereof, such that when said predetermined intensities for the diffracted orders are reached during said illumination of photosensitive layer, it is known that a pattern having at least approximately the desired critical dimension can be developed on the photosensitive layer.

12 Claims, 6 Drawing Sheets

UNEXPOSED INDEX 1.629
EXPOSED INDEX 1.6205
GRADED INDEX WIDTH 0.4μm

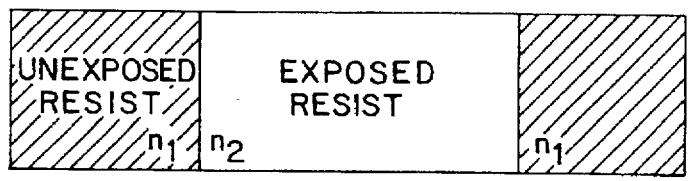
FIG. 9a
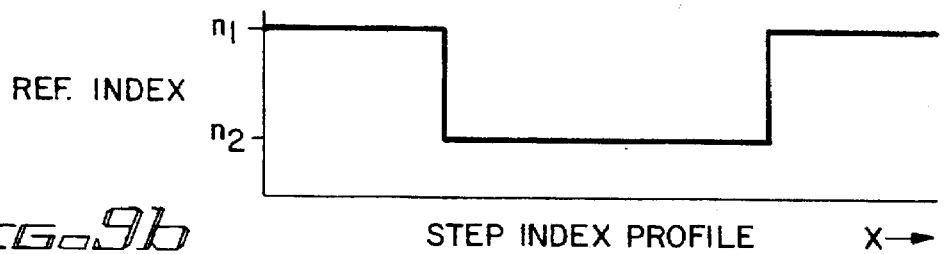
FIG. 9b  STEP INDEX PROFILE
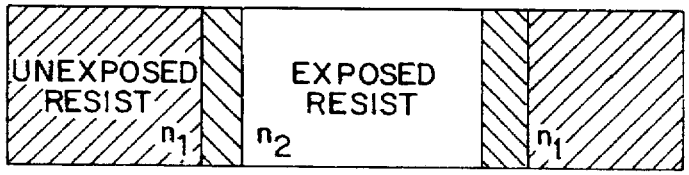
FIG. 10a
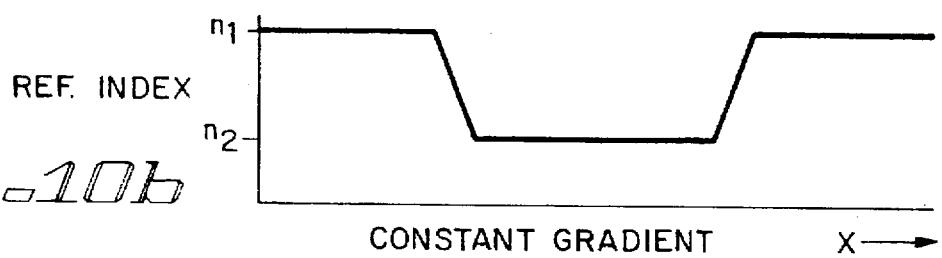
FIG. 10b  CONSTANT GRADIENT
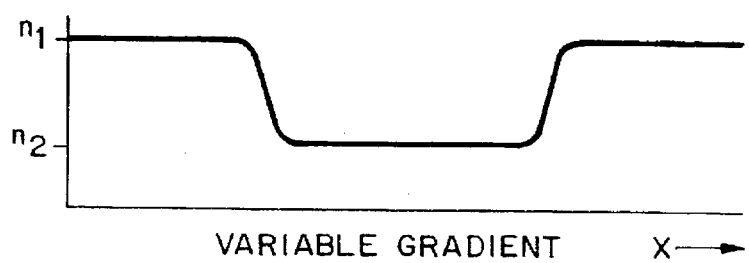
FIG. 10c  VARIABLE GRADIENT

DIFFRACTED LIGHT FROM LATENT IMAGES IN PHOTORESIST FOR EXPOSURE CONTROL

BACKGROUND OF THE INVENTION

In microelectronics manufacturing, photoresist exposure during lithography is difficult to satisfactorily control. The smallest transverse dimension of the developed photoresist, known as the critical dimension (CD), depends directly on the mount of light absorbed by the photoresist during exposure, called the exposure or photoresist dose. Presently there is no direct (in-situ or otherwise) monitor for this exposure dose. The proper dose can require different exposure times for substrates depending on their optical properties, even when the same pattern is being transferred to the photoresist. For example, metal surfaces with different surface roughness underlying the photosensitive layer or photoresist result in variations of the coupling light into the photoresist, which in turn influences the photoresist dose. Another example is a surface which has a thin transparent film at the top, such as an oxide layer. Slight deviations in the physical thickness of the layer change the optical properties of the surface, and thus, influence the amount of light which is coupled into the photoresist. The CD of the developed photoresist determines the CD of the patterned material. Because there is no direct monitor of photoresist exposure dose, changes in the optical properties of substrates can result in unacceptable variations during the manufacturing process in the patterned material.

This problem is more acute given that design geometries of integrated circuits (ICs) are shrinking as levels of circuit integration increase. For example, CDs of 1 μm for current high performance devices are common, and some fabrication processes involve CDs of 0.7 μm. Future microelectronics production facilities involve design geometries shrinking from CDs of 0.7 μm to 0.35 μm and smaller. CDs of 0.1–0.2 μm are expected in the more distant future. At the same time, die sizes (i.e. individual exposure areas) are growing, bringing increased device count and integration. Increasing wafer diameters (certainly to 10" diameter and probably to 12" diameter) and increasing automation are also expected, particularly in the lithography sector of the manufacturing process.

This increased level of integration and reduction in CD places increased demands on fabrication process control. Lithography occurs a number of times throughout integrated circuit (IC) fabrication. Estimates are that a wafer spends as much as 50% of its time in the lithography sector during microelectronics manufacturing. The dimensions (i.e. CDs) of the lines in the different patterns which are transferred must be precisely controlled throughout the fabrication process, otherwise device yield and performance suffer. The acceptable tolerance for deviations in CD is typically 10% to 20% of the CD itself, resulting in required CD control of 0.035 μm or smaller for CDs of interest now and in the near future.

One known technique used to control photoresist dose is by using a fixed exposure time, but this does not directly monitor the exposure dose delivered to the photoresist. The exposure time which is used for a specific situation is determined by calibration techniques. For example, test wafers which are coated with photoresist are exposed with the pattern of interest in a matrix of exposure times and stepper focus conditions. These test or "send-ahead" wafers are then developed and examined to determine the resultant CDs in the photoresist. The optimal exposure and focus conditions are then selected for subsequent use on production wafers. This technique, which does not directly monitor the exposure dose and cannot adapt to variations in process parameters, is undesirable for several other reasons. This technique introduces delay in the manufacturing process. The delay can be half an hour at best, to several hours, during which millions of dollars of facility might be unused, halting production. Another problem is that this technique involves an "open-loop" control process in which the exposure time for the design value of CD changes with changing optical properties of the wafer. Slight changes in processes which precede a lithography step can influence the optical properties of a wafer, and this can deleteriously impact subsequent CDs of the developed photoresist and the material which is patterned.

SUMMARY OF THE INVENTION

In accordance with the present invention, on-line monitoring and control of photoresist exposure is accomplished. The mount of light or other radiation which is absorbed by the photoresist pattern during the exposure process is directly monitored. Measurement is made of the intensity of the light diffracted from the pattern In the exposed, undeveloped photoresist, the so-called latent image. In most instances, a periodic pattern may be employed which provides well defined diffraction orders—a test pattern—or the pattern might be that of the device associated with the particular lithographic step. In general, the technique of the invention can also be adapted to a periodic structure which provides a more complex scattering pattern. Thus the technique of the invention provides on-line monitoring of diffraction or scattering from structures of the same scale as the device CD, an important factor for predicting proximity effects of subsequent pattern transfer. The technique of the invention is direct, simple, and fast. Also it is not necessary for the photoresist to be developed when the measurement is made—a very distinct advantage. Measurements can be made fast enough to allow real-time control of the exposure on the production line, in effect providing a "shutter control" for the stepper during production. Alternatively, the measurement may be made after the exposure, and corrections to the exposure time for subsequent exposures may be derived to compensate for slowly changing variations in the optical properties of the wafer. Also, the technique of the invention may be used with a variety of photoresist materials under varying conditions.

BRIEF DESCRIPTION OF THE DRAWINGS

Reference is now made to the drawings in which like reference numerals represent like parts and in which:

FIGS. 9a and 9b depicts a pattern of exposed and unexposed photoresists against a step index profile;

FIGS. 10a, b, and c depict a pattern of exposed and unexposed photoresist against constant and variable gradient index profiles.

DETAILED DESCRIPTION OF THE INVENTION

Figure 1:
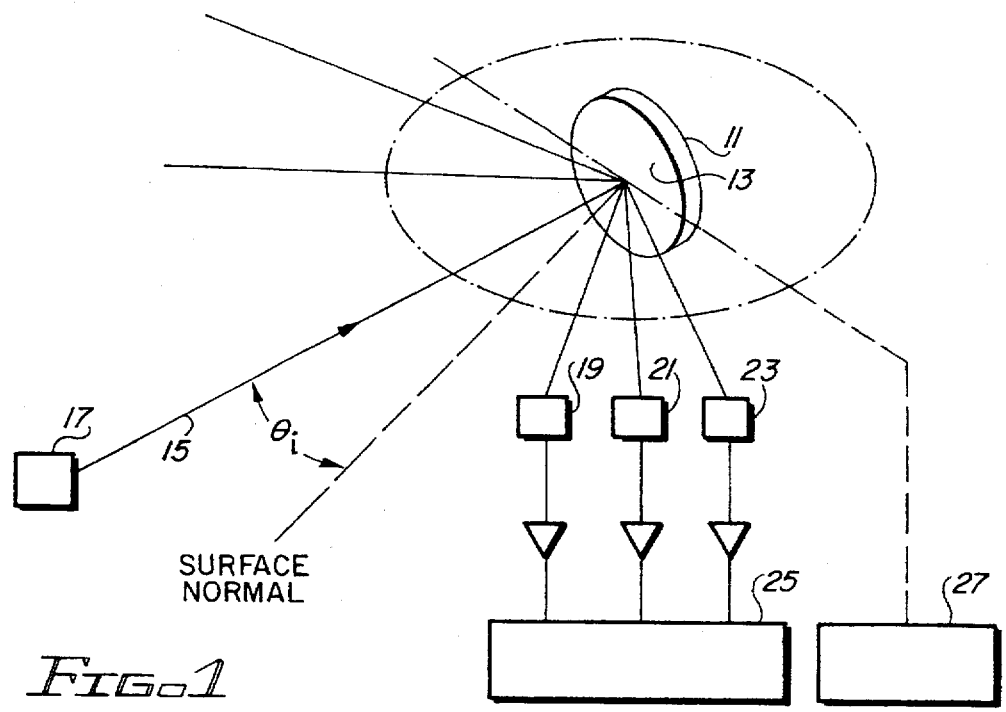
FIG. 1 is a diagrammatic view of a measuring arrangement in accordance with an embodiment of the invention.

Referring to FIG. 1, a sample 11 having a photoresist 13 with latent image thereon receives an incident beam 15 from any suitable laser source such as a He—Ne laser source 17 and specularly reflects the beam to a zero order detector 19 and reflects 1st and 2nd order diffracted beams to respective detectors 21 and 23. The outputs of the detectors 19, 21, and 23 are fed to respective amplifiers and then to a microprocessor or programmable computer 25 outfitted with measurement and comparator electronics of any suitable well known design. The output of the microprocessor 25 may be fed to any suitable well known lithography tool such as a stepper 27 for controlling photoresist exposure, as is further explained in connection with FIG. 11. The processor 25 provides a memory of tables or reference data the use of which is governed by the signals fed from detectors 19, 21, and 23. For example, the zeroth order output from detector 19 provides a measure of thin film thickness; the output from 1st order detector 21 actuates reference data which matches pattern linewidth versus 1st order diffracted power and provides input for the comparator function in the computer. The second order diffracted power from detector 23 may be combined at the comparator with that based on 1st order detector 21 to provide more accurate information on the trend of the 1st order diffracted power. The combined effect of the processing of outputs from detectors 19, 21, 23 in processor 25 is to provide a "go" or "no go" output for stepper 27 which controls the exposure time for wafer or specimen 11.

Using this arrangement, it has been demonstrated in accordance with the invention that the intensity of the 1st-order beam diffracted from the latent image in the photoresist 13 is directly related to the CD of the same pattern after the photoresist is developed. When the latent image pattern on the wafer is illuminated using a laser as illustrated in FIG. 1, the photoresist is not exposed because it is not sensitive at the laser wavelength used to illuminate the pattern. For example, when a He—Ne laser with output at 633 nm is used to examine Hunt 204 photoresist, the photoresist is sensitive at the 436 nm wavelength (g-line) used for exposure, but not at the 633 nm wavelength of the laser. As the wavelength sensitive regions of photoresist progress toward shorter wavelengths for smaller CDs, shorter wavelength sources may be used for this monitoring function providing higher resolution.

The angle of incidence and the polarization of the incident beam can be varied. These parameters greatly influence the intensity of the diffracted beams. The number of orders that is measured depends on the pitch of the periodic pattern, but in accordance with the invention measuring or characterizing 0-order and one of the 1st-orders is essential; characterizing one of the 2nd-orders is also desirable for determining the index profile. The combination of varying the input beam polarization and angle of incidence, plus measurement of multiple diffracted beams, allows additional details of the pattern to be characterized, such as sidewall angle of the resist after development. The minimum size of CD that can be characterized using the technique in accordance with the invention depends on measurement sensitivity and is approximately 0.1 µm or smaller. Also, a periodic structure having this CD may be fabricated with a pitch of 1 µm or larger, so that the 2-order diffracted beams are easily characterized using visible light. The measured intensifies of the diffracted beams are normalized to the incident beam intensity so that intensity variations of the incident beam are not an issue.

Figure 2:
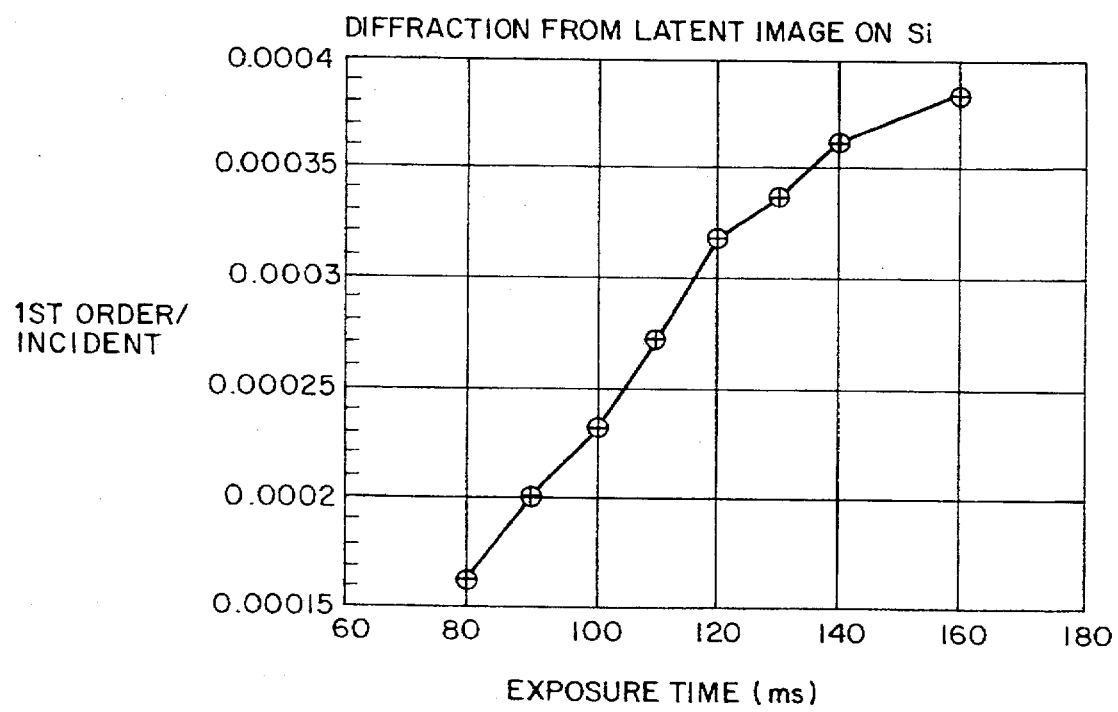
FIG. 2 is a graph of 1st order diffracted intensity of a latent photoresist image plotted against exposure time.
Figure 3:
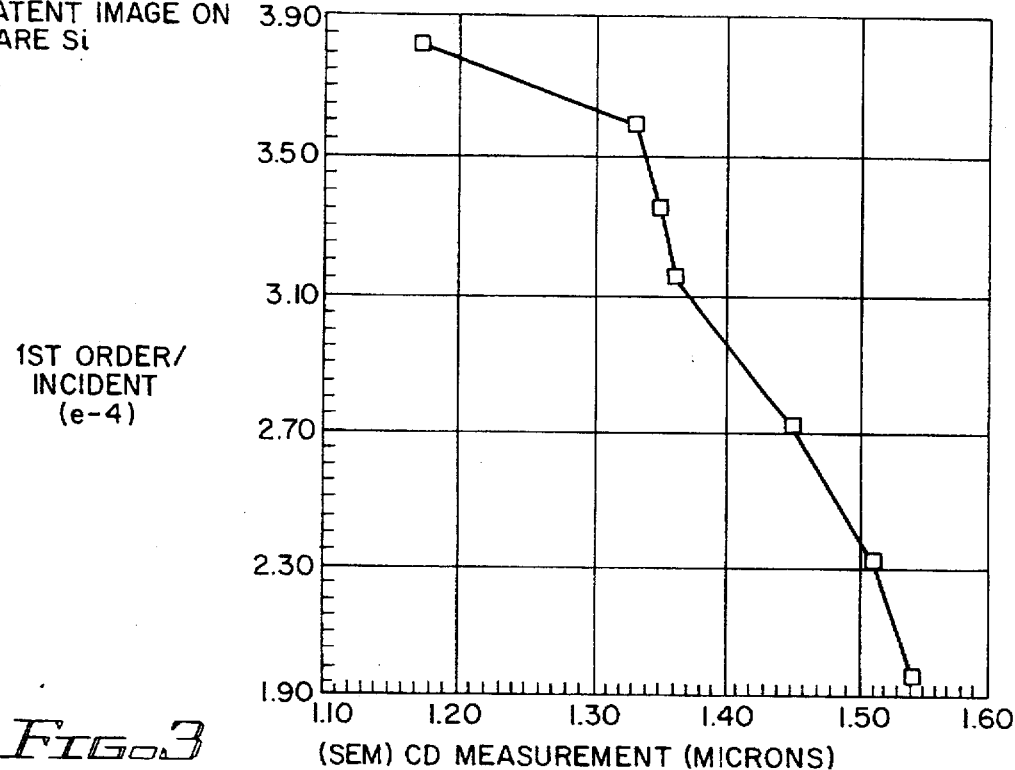
FIG. 3 is a graph showing a plot of diffracted intensity for exposed, undeveloped samples against CDs of exposed, developed samples.

The graph of FIG. 2 illustrates the dependence of 1st-order diffracted intensity from a latent image compared with the exposure time. The substrate was a Si wafer coated with approximately 1.5 µm of photoresist. Each data point on the curves represents a different position on the wafer which was exposed for the time illustrated on the horizontal axis of the plot. The photoresist was then developed and the CDs of the photoresist patterns characterized using scanning electron microscope (SEM) techniques. FIG. 3 illustrates the dependence of diffracted light intensity from the latent image on the CD of the same die in the developed photoresist. That is, the samples represented in FIG. 2 were subsequently developed, and the CDs measured by SEM techniques. FIG. 3 shows the diffracted intensity for the exposed, undeveloped samples plotted against the CDs of the exposed and developed samples. As shown in FIG. 3, the important point is that for each final CD there can be associated a unique intensity before developing the resist. This behavior is characteristic of samples which, except for the photoresist, do not have a layer at their surface which is transparent at the wavelength of the incident laser beam. In addition to the bare Si wafer, other examples include wafers which have a metal layer and samples with an antireflecting layer which is optically absorbing at the incident laser wavelength. In accordance with the invention, this technique may be used to control photoresist CD when the surface conditions such as roughness of this type of sample change.

Figure 4:
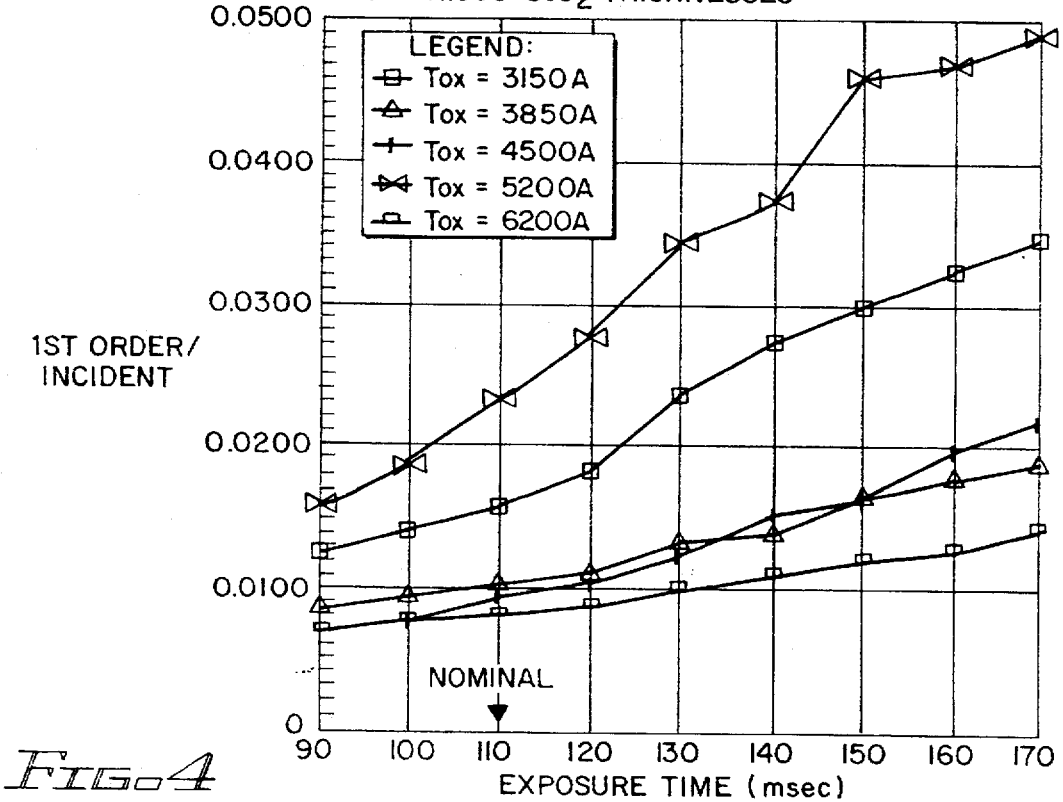
FIG. 4 is a graph of a number of plots of measured diffracted intensities from thin films varying thickness versus exposure time.
Figure 5:
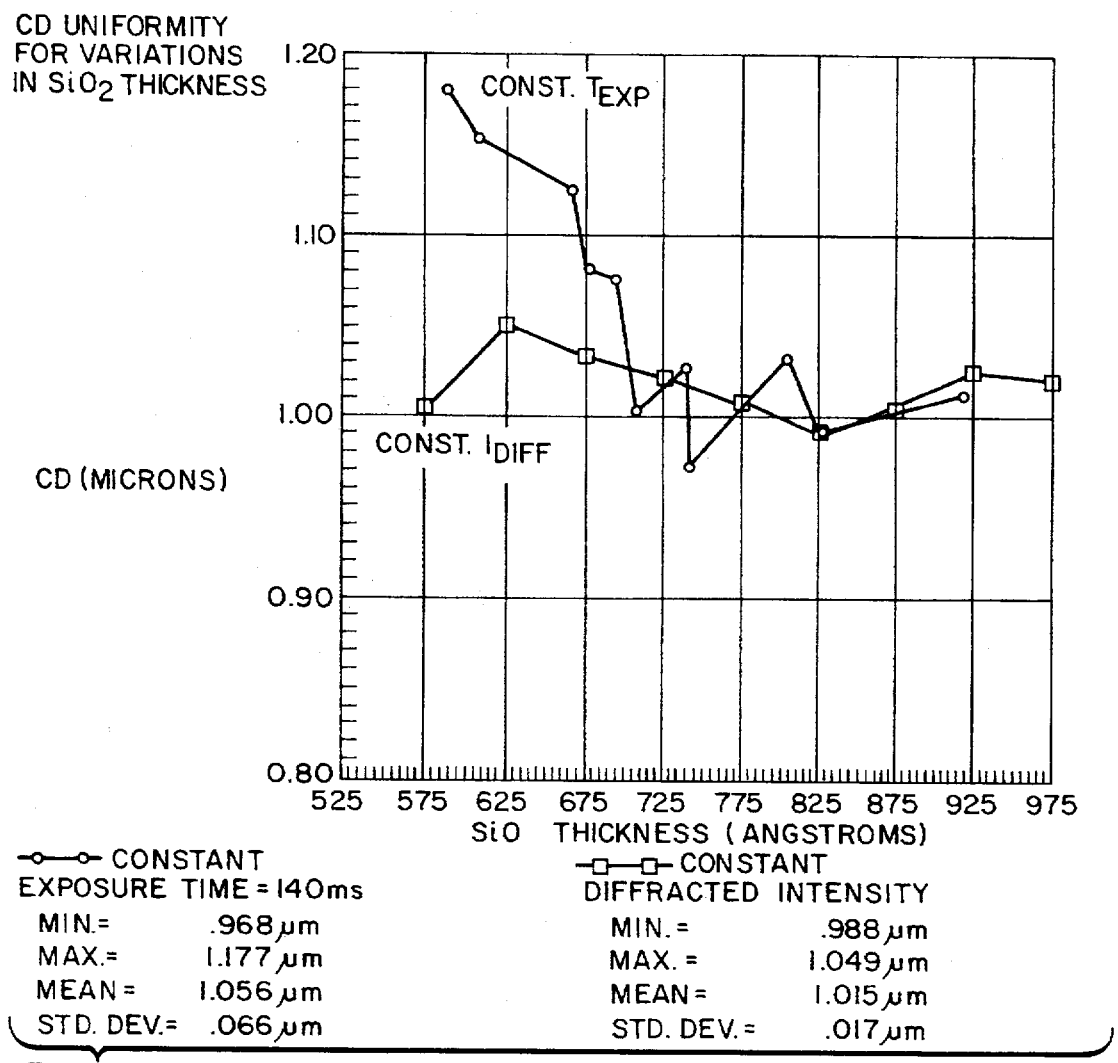
FIG. 5 is a graph plotting CD conformity versus variations in thin film thickness.

FIG. 4 illustrates data from applying the technique of the invention to a sample which has a thin transparent film of varying thickness underlying the topmost photoresist overlayer. The figure shows five plots of the measured intensity of the diffracted +1-order versus exposure time, as in FIG. 2. Each curve corresponds to a substrate having a particular thickness of $SiO_2$, and therefore different optical properties. The sample used to generate the data of FIG. 4 was then developed, and the CDs of the photoresist patterns were determined. FIG. 5 illustrates CD measurement data from a sample such as in FIG. 4. The oxide thickness of the samples differed, but they were identical otherwise. In FIG. 5 the CDs of the die are plotted versus the $SiO_2$ layer thickness for two cases: first by selecting die which had a constant exposure time; second by selecting a die which had a specific intensity in the 1st-order diffracted beam. This simulates control of the exposure process by the two different techniques. It can be seen that the variance of the CDs with changing optical properties of the substrate is significantly smaller when the diffracted first order intensity is used to control photoresist exposure time compared with using a constant exposure time.

The variation in intensity of the various orders diffracted from the latent image or phase grating as a function of exposure time is derived from rigorous theoretical analysis. The refractive index of the photoresist changes with exposure. For example, in the case of positive photoresist, the index decreases with exposure. Thus if we consider two samples exposed with a grating image for different amounts of time, the refractive indices of the latent image phase gratings created inside the photoresist will be different. Modeling of this situation is provided by simulation tools such as Prolith 2. The fraction of incident power which is diffracted from the latent image phase gratings into the various orders is determined by coupled wave analysis developed and disclosed by M. G. Moharram and T. K. Gaylord, "Diffraction Analysis of dielectric surface-relief gratings," J. Opt. Soc. Am. 72, 1885–1892 (1982). This analysis is able to account for the effect of underlying structure beneath the phase grating. This analysis has been applied and has produced excellent agreement between the experimentally observed diffracted intensity in the different orders and that predicted theoretically.

Figure 6:
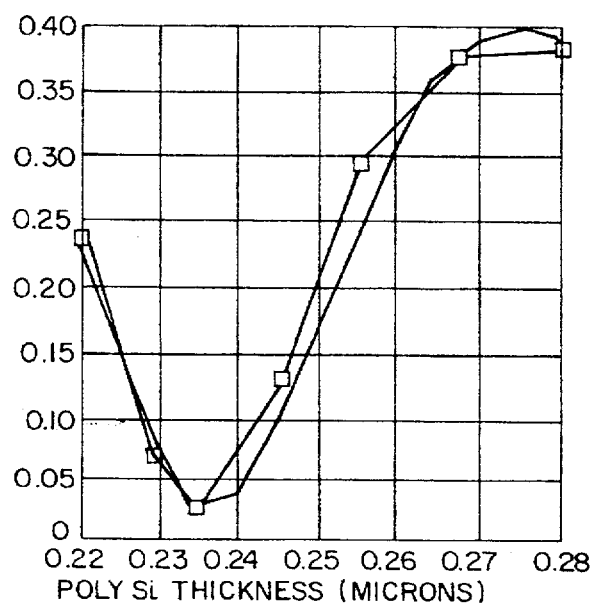
FIG. 6 is a graph plotting experimental and theoretical 0th order diffracted power versus polysilicon thin film thickness.
Figure 7:
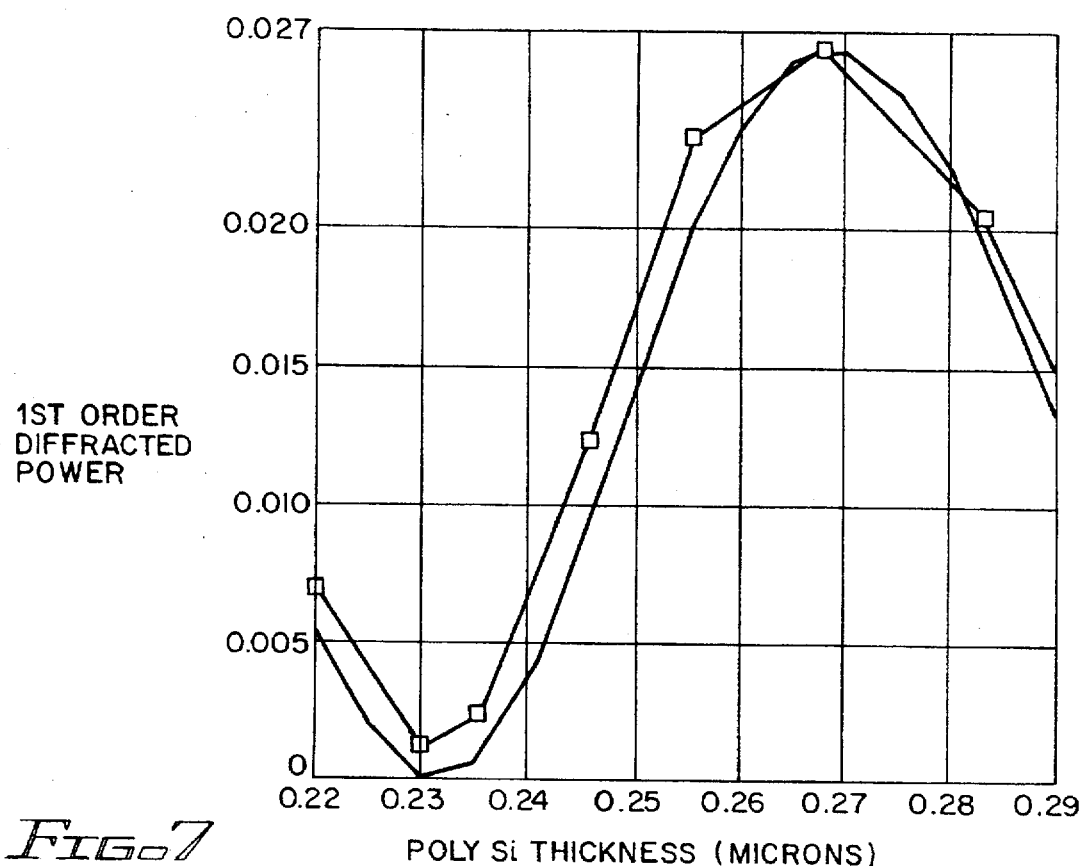
FIGS. 7 and 8 are graphs plotting experimental and theoretical 1st order diffracted power versus thin film thickness.
Figure 8:
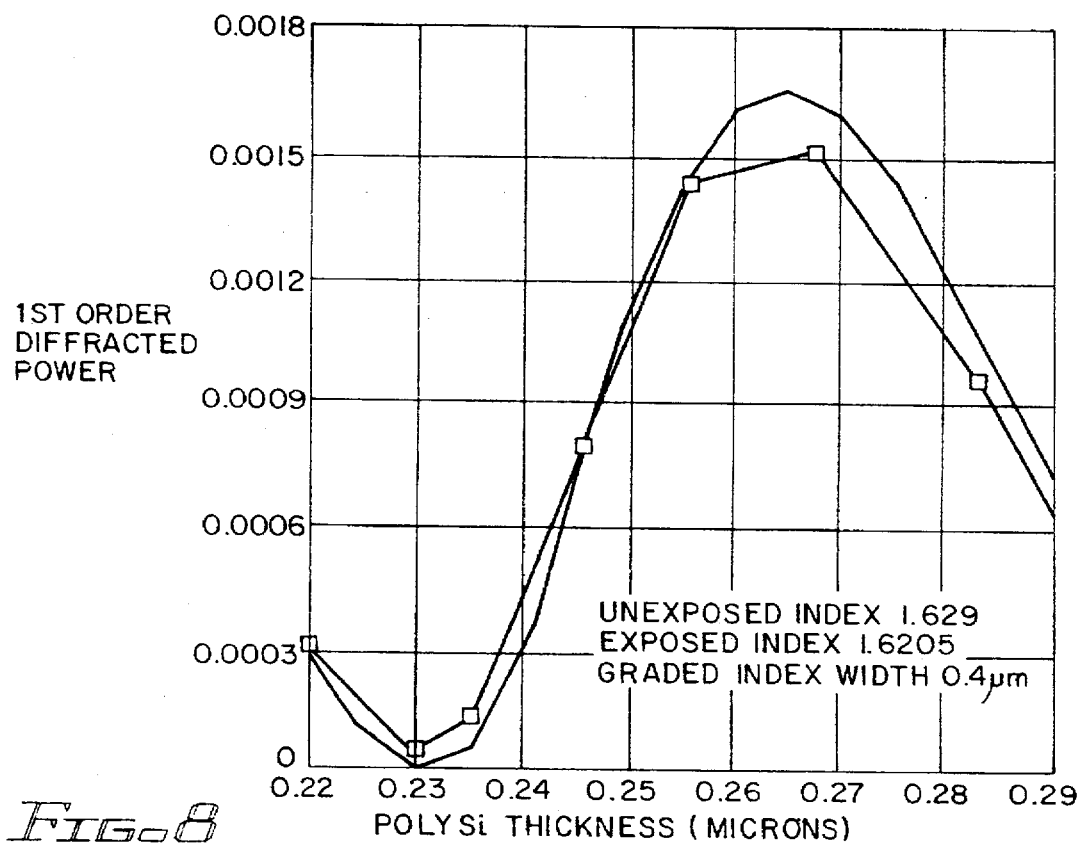

FIGS. 6–8 illustrate results which in accordance with the invention show the agreement between the theoretical and experimentally observed orders in the case of the sample having a thin transparent film. The samples both in the model and in the experiment consisted of Si wafers with an oxide layer 0.155μm thick plus a layer of polycrystalline Si of varying thickness, and a photoresist layer 1.10-μm thick. The phase grating had a pitch of 1.6-μm and a nominal linewidth (CD) of 0.7-μm. It is a Simple calculation to predict the variation of the 0-order diffracted power versus poly-Si thickness, and the calculated intensity agrees well with the measured intensity as shown in the graph of FIG. 6. This yields the optical thickness of the thin film which is required for analysis of the diffraction into higher orders. The intensity diffracted into the 1st orders can be predicted to within a multiplicative constant by assuming a simple step-index profile variation of the index within the photoresist as shown in FIG. 9. As illustrated in the graph of FIG. 7, the location of the minimum and maximum values of diffracted 1st order intensity with respect to poly-Si thickness are accurately predicted. This calculation is straightforward, and results and in accordance with the invention results are suitable for use in process control.

A more complicated analysis is also made by assuming a gradual change of the photoresist index between the exposed and unexposed regions of the photoresist pattern. This index change has been modeled to occur linearly over a region of 0.25 μm. The graphs of FIGS. 9 and 10 illustrate the different index profiles used for the calculations. FIG. 9 shows an idealized step index profile. A more elaborate model for the index change includes a linear functional form as shown in FIG. 10b and a non-linear form as illustrated in FIG. 10c. The result shown in FIG. 8 indicates excellent agreement between experimental and calculated results of the first order of diffracted power without a multiplicative factor using the linear index variation model (FIG. 10b) for the photoresist.

In accordance with the invention the measurement of 0-order intensity can be performed using multiple laser wavelengths to improve sensitivity. In this regard, the regions of the curve in FIG. 6 which contain the maximum and minimum values of the diffracted 0-order power should preferably be avoided. These regions of the curve correspond to the combined optical thickness of the film and photoresist being appropriate to either antireflect the Si wafer or to be absent. A different laser wavelength may be used such that this combined optical thickness is significantly different from that needed to antireflect the Si wafer or to be absent. The curve corresponding to that of FIG. 6 would then be more sloped in the region of 0.27 μm film thickness and therefore provide improved sensitivity. The separation of the two laser wavelengths used depends upon the optical thickness of the film/photoresist combination. For example, a He—Ne laser which is tunable to operate at five wavelengths between 544 nm and 633 nm may be used. In addition, the output from two or more different lasers may be directed into the optical system of the stepper. Many possible laser wavelengths between 325 nm and 730 nm are convenient for this application. Alternately, the angle of incidence of the beam can be adjusted to avoid the film having an optical thickness which is near a multiple quarter-wave.

Application of the technique in accordance with the invention may be used for modeling in conjunction with measurements as follows:

a. The structure is first modeled using the coupled wave analysis to theoretically predict the intensity of the beams that are diffracted. This step provides an accurate prediction of the intensity expected in the diffracted orders, for a specific CD, as a function of exposure time and optical properties of the sample. This information may be stored, for example, in a table or computer memory for subsequent use.

b. A sample is illuminated with laser output. The incident laser angle and polarization are chosen to provide optimal sensitivity of the technique. Additionally, more than one set of experimental conditions is employed, thus providing a large mount of experimental data.

c. The intensity of diffracted light in the 0-order is measured to establish the optical thickness of the transparent film on the sample. This measurement is performed either prior to or during photoresist exposure, as the intensity of this 0-order beam is not significantly influenced by the photoresist exposure. Two or more laser wavelengths may be used for this measurement to optimize the sensitivity as previously described. If the sample does not have a transparent film, this measurement establishes the specular reflectance of the surface.

d. The intensities of one or more of the 1-orders and 2-orders are monitored during exposure. At the intensity levels predetermined by the analysts (a, above), the exposure is halted.

e. If the anticipated or predetermined intensity levels for the diffracted orders are not detected, indication is provided that there is a process problem, such as an undesired film thickness or incorrect exposure level.

If desired, to closely monitor the results of this procedure during production, test samples which have approximately the same properties as those being fabricated by the process above can be characterized. The diffraction from latent images of the structures are measured, and the samples are developed and characterized using SEM techniques. This step is used to establish details of the photoresist structure and is useful information for monitoring the modeling procedure. Note that this step is not required on a routine basis, as this characterizes aspects of the lithography apparatus which are specific to the photoresist, pattern, and stepper which are used in the process, and these do not vary from sample-to-sample.

Figure 11:
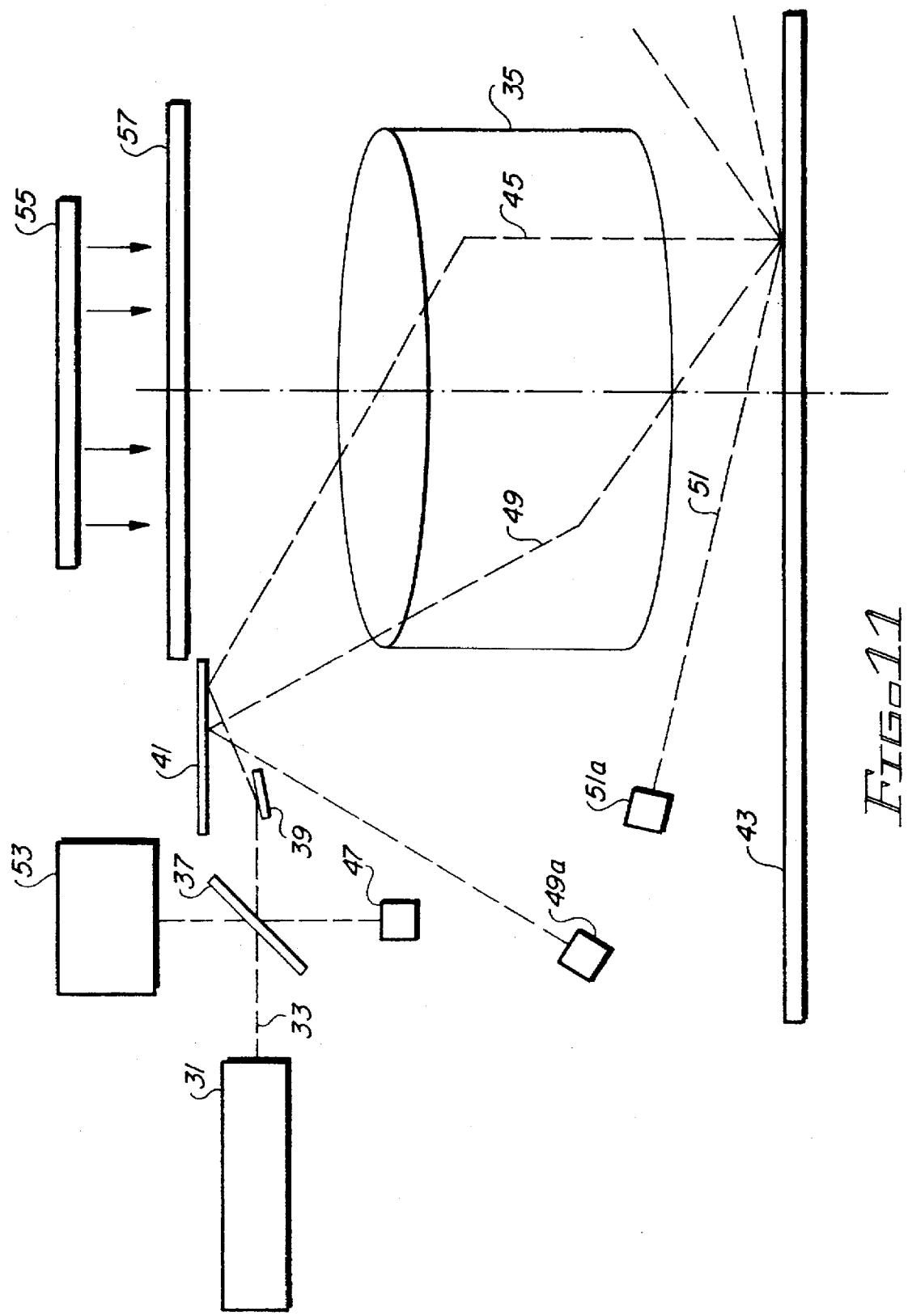
FIG. 11 is a view of an embodiment of the invention as it is implemented on a stepper.

It should be understood that the monitoring technique of the invention can be accomplished in at least two ways. The measurements can be performed "off-line" on wafers which have already been exposed but not developed. The wafers are examined, for example, by apparatus which may be located close to or coupled with the stepper for control of exposure as illustrated in FIG. 1. The measurements are performed rapidly (fraction of a second per die), in a repetitive manner in which the same pattern is exposed and examined. Only a few detector elements are required, and they may be in fixed positions as indicated in FIGS. 1 and 11.

The measurement technique of the invention is preferably implemented during production on the stepper and thus used "on-line". As shown in FIG. 1, and in greater detail in FIG. 11 a stepper implementation is illustrated. In FIG. 11, a laser source 31 produces a beam output 33 directed into a stepper projection lens 35 via beam splitter 37 and mirrors 39 and 41 onto the wafer or die 43 having a photoresist being exposed at normal or near-normal incidence. The 0-order (specularly reflected) beam 45 from the wafer or die 43 travels through the stepper lens 35, is split by the beam splitter 37, and is measured by a detector 47 of any suitable well known construction. Higher diffraction orders may be diffracted at angles such that they too pass through the lens and are measured in a similar manner as the 0-order beam. First and second order diffracted beams 49 and 51 might be diffracted at angles too large to enter the projection lens, as illustrated, and they are measured by detectors 49a and 51a respectively. Characterizing the diffracted light is sufficiently rapid to provide a shutter control to implement exposure dose control. A reference detector 53 may be provided to monitor the power output of beam 33 via beam splitter 37. As shown in FIG. 1 the stepper light source is controlled (e.g. turned on and off), or a shutter operated to block the light from a pattern source 55 via reticle 57 as desired to thereby control exposure.

In accordance with the invention, both methods of implementation, "on line" and "off line" include the ability to monitor the incident beam intensity. Measurements of diffracted beam intensities by detectors 49a, 51a and 47 are normalized to the incident beam intensity measured by detector 53 to accommodate incident beam fluctuations. Microprocessor or computer 25 may be used for this purpose.

The laser beam may illuminate the die at a large angle of incidence such that it is not directed through the projection lens of the stepper. Also, the laser beam 33 may be directed at a die which is different from the one being exposed on the production line. In this case the laser might illuminate a die which had been exposed on the production line some number of steps previously. Monitoring a die this far removed from the one under exposure does not introduce excessive uncertainty, because this is consistent with the dimensions on a wafer over which optical properties change. These variations in the measurement technique may facilitate production.

What is claimed is:

1. In microelectronics manufacturing, the method of monitoring and enabling control of the extent of exposure of an undeveloped, latent image-containing photosensitive layer on a structure susceptible to variations in optical properties, said method enabling the attaining of a desired critical dimension for the pattern to be developed in the photosensitive layer, comprising:

a. ascertaining through analysis the predetermined intensities for one or more respective orders of diffracted power for an incident beam of radiation corresponding to the desired critical dimension for the photosensitive layer as a function of exposure time and optical properties of the structure;

b. illuminating the photosensitive layer with a beam of radiation of one or more frequencies to which the photosensitive layer is not exposure-sensitive;

c. monitoring the intensities of the orders of diffracted radiation due to said illumination including at least the first order of diffracted radiation thereof, such that when said predetermined intensities for the diffracted orders are reached during said illumination of the photosensitive layer, it is known that a pattern having at least approximately the desired critical dimension can be developed on the photosensitive layer by ceasing exposure or further exposing the layer to radiation to which it is sensitive.

2. The method of claim 1 including the additional step of:

d. measuring the intensity of the zero order of diffracted radiation to determine specific optical properties of the structure.

3. The method of claim 2 wherein the step of ascertaining includes the step of storing said predetermined intensities, and wherein the step of monitoring includes the step of comparing said stored, predetermined intensities with said monitored intensities.

4. The method of claim 3 including the further step of:

e. developing an output control signal from comparison of the stored, predetermined intensities with the monitored intensities to enable control of the exposure time of the photosensitive layer.

5. The method of claim 4 wherein said control signal may be applied concurrently with the exposure of the photosensitive layer.

6. The method of claim 2 wherein the orders of diffracted radiation analyzed in step a. and monitored in step c. include the zero and first orders.

7. The method of claim 1 wherein the orders of diffracted radiation analyzed in step a. and monitored in step c. include the first and second orders.

8. The method of claim 1 wherein the step of illuminating includes the step of adjusting the angle of incidence of the beam to optimize sensitivity.

9. The method of claim 4 including the additional step of:

f. moving the structure from one exposure position of the photosensitive layer to another in response to the control signal.

10. The method of claim 2 wherein said beam of radiation includes at least one laser beam.

11. The method of claim 3 wherein said beam of radiation includes at least two laser beams of differing frequencies.

12. The method of claim 2 wherein step c. includes monitoring the energy level of the incident radiation.

* * * * *

UNITED STATES PATENT AND TRADEMARK OFFICE
CERTIFICATE OF CORRECTION

PATENT NO. : 5,674,652

DATED : October 7, 1997

INVENTOR(S) : Bishop et al.

It is certified that error appears in the above-identified patent and that said Letters Patent is hereby corrected as shown below:

Column 1, line 7, before "In" insert --The U.S. Government has rights in this invention pursuant to Contract No. DE-AC04-76DP00789 between the United States Department of Energy and American Telephone & Telegraph Company.--

Signed and Sealed this

Twenty-fourth Day of March, 1998

Attest:

BRUCE LEHMAN

*Attesting Officer*    *Commissioner of Patents and Trademarks*